United States Patent
Dinu-Gurtler et al.

(10) Patent No.: US 11,557,455 B2
(45) Date of Patent: Jan. 17, 2023

(54) CHARGED PARTICLE SOURCE MODULE

(71) Applicant: ASML Netherlands B.V., Veldhoven (NL)

(72) Inventors: Laura Dinu-Gurtler, Delft (NL); Eric Petrus Hogervorst, Delft (NL); Jurgen Van Soest, Delft (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/600,364

(22) Filed: Oct. 11, 2019

(65) Prior Publication Data
US 2020/0043693 A1 Feb. 6, 2020

Related U.S. Application Data

(63) Continuation of application No. PCT/JP2018/015632, filed on Apr. 10, 2018, which is
(Continued)

(51) Int. Cl.
*H01J 37/04* (2006.01)
*H01J 37/10* (2006.01)
(Continued)

(52) U.S. Cl.
CPC .......... *H01J 37/04* (2013.01); *G03F 7/70016* (2013.01); *H01J 37/10* (2013.01);
(Continued)

(58) Field of Classification Search
CPC .......... H01J 37/04; H01J 37/10; H01J 37/244; H01J 37/3175; H01J 2237/061; G03F 7/70016; H01L 21/263
See application file for complete search history.

(56) References Cited

U.S. PATENT DOCUMENTS

| 2,914,692 A | 11/1959 | Mahn |
| 3,857,055 A | 12/1974 | Shirai et al. |

(Continued)

FOREIGN PATENT DOCUMENTS

| CN | 1411047 A | 4/2003 |
| CN | 204230202 U | 3/2015 |

(Continued)

OTHER PUBLICATIONS

Partial Supplementary European search report (R. 164 EPC) issued in related Application No. 18784630.8, dated Jan. 15, 2021 (7 pgs.).
(Continued)

*Primary Examiner* — Timor Karimy
(74) *Attorney, Agent, or Firm* — Finnegan, Henderson, Farabow, Garrett & Dunner, LLP

(57) ABSTRACT

The disclosed embodiments relate to a charged particle source module for generating and emitting a charged particle beam, such as an electron beam, comprising: a frame including a first frame part, a second frame part, and one or more rigid support members which are arranged between said first frame part and said second frame part; a charged particle source arrangement for generating a charged particle beam, such as an electron beam, wherein said charged particle source arrangement, such as an electron source, is arranged at said second frame part; and a power connecting assembly arranged at said first frame part, wherein said charged particle source arrangement is electrically connected to said connecting assembly via electrical wiring.

20 Claims, 5 Drawing Sheets

Related U.S. Application Data a continuation of application No. 15/484,974, filed on Apr. 11, 2017, now abandoned.

(51) Int. Cl.
*G03F 7/20* (2006.01)
*H01J 37/244* (2006.01)
*H01J 37/317* (2006.01)
*H01L 21/263* (2006.01)

(52) U.S. Cl.
CPC ........ *H01J 37/244* (2013.01); *H01J 37/3175* (2013.01); *H01L 21/263* (2013.01); *H01J 2237/061* (2013.01)

(56) References Cited

U.S. PATENT DOCUMENTS

| | | | |
|---|---|---|---|
| 3,878,424 A | 4/1975 | Suganuma | |
| 5,483,074 A | 1/1996 | True | |
| 2008/0067411 A1* | 3/2008 | Nishino | H01J 27/14 250/423 R |
| 2009/0224650 A1 | 9/2009 | Kim | |
| 2011/0042579 A1 | 2/2011 | De Boer et al. | |
| 2015/0136995 A1 | 5/2015 | Wieland et al. | |

FOREIGN PATENT DOCUMENTS

| | | |
|---|---|---|
| JP | Y 58-54769 | 12/1983 |
| JP | 5580849 B2 | 8/2014 |
| TW | 201239940 A | 10/2012 |

OTHER PUBLICATIONS

PCT International Search Report and PCT Written Opinion issued in corresponding PCT Application No. PCT/JP2018/015632, dated Jul. 3, 2018 (6 pgs.).
De Boer, et al.; "MAPPER: progress towards a high-volume manufacturing system"; Proc. of SPIE, Mar. 26, 2013, vol. 8680, #86800 (Abstract p. 1).
Partial Supplementary European Search Report issued in related Application No. EP 18 78 4630, dated May 26, 2021 (6 pgs.).
Notification of the First Office Action issued by the Patent Office of the People's Republic of China in related Chinese Patent Application No. 2018800313553; dated Jul. 5, 2021 (31 pgs.).
Search Repot issued in related Chinese Patent Application No. 2018800313553; dated Jun. 24, 2021 (4 pgs.).
Office Action of the Intellectual Property Office issued in related Taiwanese Patent Application No. 107112278; dated Feb. 23, 2022 (17 pgs.).

\* cited by examiner

CHARGED PARTICLE SOURCE MODULE

CROSS-REFERENCE TO RELATED PATENT APPLICATIONS

This application claims priority to International Application No. PCT/JP2018/015632, filed on Apr. 10, 2018, which claims priority to U.S. application Ser. No. 15/484,974, which was filed on Apr. 11, 2017. The contents of these applications are each incorporated herein by reference in their entirety.

BACKGROUND

The disclosed embodiments relate to a charged particle source module for generating and emitting a charged particle beam. The disclosed embodiments further relate to an exposure system with said charged particle source module, a charged particle source arrangement, a method for manufacturing a semiconductor device and a method for inspecting a target.

Charged particles sources are arranged for generating and emitting a beam of charged particles, which beam of charged particles may be directed towards a surface or a target. A known charged particle source comprises a source cathode and multiple electrodes located downstream of said source cathode.

A charged particle source is known from WO 2015/101538 A1 of the Applicant, where the source is applied in a lithographic exposure system. The charged particle source comprises a cathode arrangement comprising: a thermionic cathode comprising an emission portion provided with an emission surface for emitting electrons, and a reservoir for holding a material, wherein the material, when heated, releases work function lowering particles that diffuse towards the emission portion and emanate at the emission surface at a first evaporation rate; a focusing electrode comprising a focusing surface for focusing the electrons emitted from the emission surface of the cathode; and a heat source configured for heating the material held in the reservoir.

Another charged particle source is known from Proc. of SPIE, Vol. 8680, 868000-1 to −12, see FIGS. 6, 7 and 8.

The known charged particle sources are, apart from use in charged particle exposure systems, such as charged particle lithography systems, also applied in charged particle inspection systems or microscopes. At least in these applications, the individual components of the charged particle source must be accurately aligned with respect to each other. In addition, connecting the individual components of the charged particle source to corresponding power supply arrangements is cumbersome and must be performed with care not to disturb the alignment of the individual components of the charged particle source with respect to each other.

It is an object of the disclosed embodiments to ameliorate or to eliminate one or more disadvantages of the prior art, or to at least provide an alternative charged particle source.

SUMMARY

According to a first aspect, the disclosed embodiments provide a charged particle source module for generating and emitting a charged particle beam, comprising:
  a frame including a first rigid frame part, a second rigid frame part, and one or more rigid support members which are arranged between and rigidly connected to said first frame part and said second frame part;
  a charged particle source arrangement for generating a charged particle beam, wherein said charged particle source arrangement is arranged at said second frame part; and
  a power connecting assembly arranged at said first frame part,
  wherein said charged particle source arrangement is electrically connected to said power connecting assembly via electrical wiring.

According to the first aspect of the disclosed embodiments, said charged particle source arrangement is arranged at said second frame part and is electrically connected to said power connecting assembly via electrical wiring, which power connecting assembly is arranged at said first frame part.

Since said power connecting assembly is arranged at said first frame part, a force applied to said power connecting assembly, for example during connection of an external power supply to said power connecting assembly, can be led into the first frame part. The force led into the first frame part can be transferred from said first frame part to said second frame part via the rigid support members, therewith preventing that said force acts on said charged particle source arrangement or the individual components thereof. Thereby, a strain relieving arrangement is provided. As a result of the strain relieving arrangement, the alignment and the relative positions of the individual components of said charged particle source arrangement with respect to each other is maintained.

The charged particle source arrangement may be arranged for generating an electron beam. The charged particle source arrangement may comprise an emitter arrangement for emitting electrons, from which an electron beam is formed.

Additionally, the use of said charged particle source module according to the disclosed embodiments may provide for a robust arrangement which reduces or in an ideal case eliminates one or more external forces exerted on said charged particle source arrangement for example during transport of said source module, during mounting of said source module into an exposure system, and during connection of an external power supply to said charged particle source module.

Furthermore, the power connecting assembly provides an appropriate substantially single connection terminal at which the charged particle source module can be connected to the required power supply and control leads for controlling the functioning of said charged particle source arrangement.

According to a second aspect, the disclosed embodiments provide a charged particle source module for generating and emitting a charged particle beam, comprising:
  a frame including a first frame part, a second frame part, and one or more rigid support members which are arranged between said first frame part and said second frame part;
  a charged particle source arrangement for generating a charged particle beam, wherein said charged particle source arrangement is arranged at said second frame part; and
  a power connecting assembly arranged at said first frame part,
  wherein said charged particle source arrangement is electrically connected to said power connecting assembly via electrical wiring, wherein said electrical wiring comprises one or more wires with a service loop.

In the context of the present patent application, a service loop has to be understood as an extra length of electrical wire, preferably provided in a bend or loop, which is included as a strain relieving measure. Such bend may be included for example as a portion of the electrical wire extending with a bend in a direction substantially perpendicular to the direction of the one or more electrical wires. During use, electrical power runs through said one or more electrical wires thereby increasing the temperature of said one or more electrical wires. The increasing temperature of said one or more electrical wires results in thermal expansion of said one or more electrical wires. Thermal expansion of said one or more electrical wires can be absorbed by the service loop of the respective electrical wire. Therewith, it is prevented that a force is applied to said charged particle source arrangement due to thermal expansion of said one or more electrical wires.

Additionally, in case that a (small) part of a force applied to said power connecting assembly is transferred towards said charged particle source arrangement via said power connecting assembly, said force is absorbed by said service loops of said electrical wires. It is therewith prevented that a force is applied to said charged particle source arrangement.

In an embodiment said frame comprises mounting members which are connected to said second frame part by flexure connections, preferably wherein said second frame part comprises a mounting plate and each of said flexure connections comprises a connecting lip provided at the outer circumference of said mounting plate, wherein each connecting lip defines a slit between said mounting plate and said connecting lip. Said mounting members are intended to mount said charged particle source module to an exposure system or to a charged particle optical arrangement of an exposure system. In operation, said charged particle source arrangement generates and emits a charged particle beam which is directed towards said second frame part. It might occur that a part of the charged particle beam or a number of some charged particles impinge(s) on said second frame part directly or indirectly, which results in an increased temperature of said second frame part. Due to the increased temperature, said second frame part may deform in a substantially radial direction with respect to the longitudinal center axis of said charged particle source module. Said flexure connections with said connecting lips as well as said slits enable the second frame part to deform in a substantially radial direction with respect to the longitudinal center axis of said charged particle source module, while said mounting members remain in position and said charged particle source module is kept aligned to the exposure system or with the charged particle optical arrangement, preferably in a direction traverse to the longitudinal axis of said charged particle source module.

Additionally, said mounting members which are connected to said second frame part by flexure connections provide the possibility to mount said charged particle source module to a not perfectly flat surface. Due to the mounting members within the flexure connections a proper abutment of said charged particle source module to for example a charged particle optical arrangement is established.

In an embodiment said first frame part, said second frame part and/or said one or more rigid support members are made of non-ferrous material. Non-ferrous material includes non-magnetic properties, which has to be understood as being not magnetic and being not magnetizable. An advantage of this embodiment is that the charged particles within the charged particle beam generated by the charged particle source arrangement are not influenced by the frame or the components thereof.

In an embodiment said power connecting assembly is rigidly connected to said first frame part, and said charged particle source arrangement is rigidly connected to said second frame part. When said power connecting assembly is rigidly connected to said first frame part, it is prevented that said first frame part and said power connecting assembly move with respect to each other, such as rotating around and/or tilting with respect to the longitudinal axis of said frame, when a force applied to the power connecting assembly is led into said first frame part. Such movement may be detrimental to for example said charged particle source arrangement or said electrical wiring between said charged particle source arrangement and said power connecting assembly. Said charged particle source arrangement is rigidly connected to said second frame part for substantially the same reason.

In an embodiment said power connecting assembly comprises an electrically non-conductive connecting plate which is arranged at said first frame part of said frame, wherein said power connecting assembly comprises one or more connectors. By using a non-conductive connecting plate in combination with connectors, said power connecting assembly enables an external power supply to be connected to said power connecting assembly for providing electrical energy to said charged particle source arrangement, while it is prevented that said electrical energy is applied to said frame.

In an embodiment said one or more connectors extend through said electrically non-conductive connecting plate in a direction substantially parallel to said support members of said frame. As a result of the connectors extending substantially parallel or parallel to said rigid support members, a force applied to said connectors during for example connection of an external power supply to said connectors can be led easily towards and into said support members since the applied force continues in substantially the same direction as in which it is applied. The risk to any force being applied to said charged particle source arrangement is therefore reduced or in the ideal case eliminated.

In an embodiment said first frame part comprises two substantially parallel plates, wherein the power connecting assembly is secured, preferably clamped between said two plates. A movement of said power connecting assembly in a direction parallel to said support members would exert a detrimental force to said charged particle source arrangement or said electrical wiring between said charged particle source arrangement and said power connecting assembly. Such detrimental force distorts the charged particle source arrangement and/or the electrical wiring thereof negatively. By clamping the power connecting assembly between two plates, it is prevented that the power connecting assembly moves along the direction substantially parallel to said support members or rotates about a rotation axis extending through said power connecting assembly in a direction substantially perpendicular to said support members, when a force is exerted onto said power connecting assembly.

In an embodiment said charged particle source arrangement comprises an emitter arrangement configured for emitting charged particles, and an electrode for forming a charged particle beam from said charged particles emitted by said emitter arrangement, preferably wherein said charged particle source arrangement comprises two or more electrodes for forming a charged particle beam from said charged particles emitted by said emitter arrangement, wherein a most downstream electrode of said two or more electrodes is preferably arranged at said second frame part of said frame, wherein said most downstream electrode and said second frame part are preferably formed as a single part. By using said most downstream electrode both to shape the charged particle beam generated and emitted by said emitter arrangement and to secure said charged particle source arrangement to said second frame part of said frame, the number of parts of said charged particle source module may be kept to a minimum.

In an embodiment said emitter arrangement and said electrode are connected to one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other, preferably wherein at least one of said emitter arrangement and said electrode is connected with said one or more supports by means of a flexure connection. Said supports are provided for maintaining the orientation and/or the position of said electrode and said emitter arrangement with respect to each other. During operation, said emitter arrangement generates and emits a charged particle beam which is shaped by means of said electrode. A part of said charged particle beam or a number of individual charged particles from said emitter arrangement may impinge on said electrode, which leads to an increased temperature of said electrode. An increased temperature of said electrode may lead to deformation, in particular expansion of said electrode. Since said electrode is connected to said supports, such deformation leads to bending and/or warping of said electrode when not provided with a flexure connection, therewith distorting an electrical field formed between said electrode and said emitter arrangement. Said flexure connection enables said electrode to deform substantially in a radial direction with respect to the longitudinal center axis of said charged particle source arrangement while said supports maintain the position thereof and warping and/or bending of said electrode is prevented. Moreover, said electrode maintains the (intended) charged particle optical function thereof.

In an embodiment a plurality of said electrodes is provided. By the flexure connection provided at each electrode the mutual orientation and/or position can be maintained. Thereby, the charged particle optical function, for example a lens function, is maintained.

In an embodiment at least one of said emitter arrangement and said electrode is rigidly connected to said one or more supports, preferably wherein said most downstream electrode is rigidly connected to said one or more supports. Said most downstream electrode is arranged at said second frame part and, during operation, may be connected to an exposure system or a charged particle optical arrangement thereof. The thermal energy introduced by the charged particles impinging on and absorbed by said most downstream electrode is led towards said second frame part and/or said exposure system or said charged particle optical arrangement thereof. Optionally, said charged particle optical arrangement is actively cooled. An increase of the temperature of said most downstream electrode due to charged particles impinging onto said most downstream electrode is therefore counteracted.

In an embodiment said emitter arrangement and said electrode comprise a plate-shaped electrode body, wherein said flexure connection comprises a connecting lip provided at the outer circumference of said plate-shaped electrode body, wherein said connecting lip defines a slit between said connecting lip and said plate-shaped electrode body. As explained before, due to charged particles impinging onto said electrode, the temperature of said electrode increases, which can lead to thermal expansion of said electrode radially outwards with respect to the longitudinal center axis of said frame. Such thermal expansion of said electrode is enabled by said flexure connection with said connecting lip and said slit defined by said connecting lip. The inner end of the slit may be provided with a circular inner shape or as a hole having circular shape, the radius of which being larger than the distance between the lip and the electrode formed by the slit. In some embodiments, the slit further comprises a bend. Also this bend may comprise a circular inner shape. The circular inner shapes may contribute to the thermal expansion taking place in radial direction.

In an embodiment, when said power connecting assembly comprises an electrically non-conductive connecting plate which is arranged at said first frame part of said frame, wherein said power connecting assembly comprises one or more connectors, said electrical wiring is peripherally connected to said electrode and is connected to said one or more connectors, and wherein the electrical wiring extends in a direction substantially parallel to said support members of said frame. Thus, the electrical wiring is extending directly, in particular straight, from the periphery of the electrode to a respective connector. As the position of the connectors at the non-conductive connecting plate is substantially determined by the periphery of the underling electrode, the connectors can be placed remote from each other. An advantage of this embodiment is that the connectors can be provided at a safe distance from each other, such that mutual electrical contact between said connectors is prevented.

In an embodiment the electrical wiring is flexible electrical wiring. In the context of the present patent application, the term 'flexible' has to be understood as being capable of bending or being bent, but still having a determined degree of rigidity. In the case that said force is applied to the power connecting assembly and a part of said force is transferred into said flexible electrical wiring, said transferred force can be absorbed by the electrical wiring, at least partly, due to the flexibility thereof. Due to the flexible electrical wiring absorbing at least a part of said force, it is prevented that said transferred force acts on the individual components of said charged particle source arrangement. As a result thereof, the alignment and the relative positions of the individual components of said charged particle source arrangement with respect to each other is maintained.

In an embodiment, when said first frame part is a first rigid frame part, said second frame part is a second rigid frame part, and said one or more rigid support members are rigidly connected to said first frame part and said second frame part, said flexible electrical wiring comprises one or more wires with a service loop.

According to a third aspect, the disclosed embodiments provide an exposure system for emitting a charged particle beam towards a surface or a target, comprising:
  a charged particle source module for generating and emitting a charged particle beam according to the first aspect of the disclosed embodiments or according to the second aspect of the disclosed embodiments; and
  a charged particle optical arrangement configured to receive the charged particle beam generated and emitted by the charged particle source module, and to direct said charged particle beam towards said surface or said target, wherein said second frame part of said frame is arranged at said charged particle optical arrangement.

Since said power connecting assembly is arranged at said first frame part and said second frame part is arranged at said charged particle optical arrangement, a force applied to said power connecting assembly, for example during connecting an external power supply to said power connecting assembly, can be led into the first frame part. The force led into the first frame part can be transferred from said first frame part to said charged particle optical arrangement via the rigid support members and said second frame part and can be absorbed by said charged particle optical arrangement. It is therewith prevented that said force acts on said charged particle source arrangement and a strain relieving arrangement is hereby provided. Said frame with said power connecting assembly provides a force path between said power connecting assembly and said second frame part, in particular between the power connecting assembly and said charged particle optical arrangement of said exposure tool.

In an embodiment said charged particle optical arrangement comprises a collimator, wherein said charged particle source module is arranged at said collimator.

During operation of the exposure tool, charged particles originating from said charged particle source arrangement may deviate from a generated charged particle beam and impinge onto a part of said charged particle source arrangement or said frame. The kinetic energy of such deviated charged particles is absorbed by said part of said charged particle source arrangement or said frame, which eventually leads to an increased temperature thereof. By arranging said second frame part on which said charged particle source arrangement is arranged at said charged particle optical arrangement, thermal energy absorbed by the second frame part or the part of said charged particle source arrangement arranged at said second frame part can be conducted towards and into said charged particle optical arrangement. It is therewith prevented that the temperature of said second frame part or said part of said charged particle source arrangement increases or increases significantly. Optionally, the charged particle optical arrangement or a part thereof on which said charged particle source module is arranged may be actively cooled.

In an embodiment the exposure system is selected from a group comprising a lithography system, an inspection system or a microscopy system.

According to a fourth aspect, the disclosed embodiments provide a charged particle source arrangement for generating a charged particle beam, comprising:
- an emitter arrangement configured for emitting charged particles;
- an electrode for forming a charged particle beam from said charged particles emitted by said emitter arrangement; and
- one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other, wherein said electrode is connected with said one or more supports by means of a flexure connection, wherein said electrode and/or or said emitter arrangement comprises one or more electrical wire connections for connection of electrical wiring, wherein at least one of said one or more electrical wire connections is arranged on said flexure connection.

Said supports are arranged to maintain said emitter arrangement and said electrode between said supports, in order to maintain the orientation and/or the position of said electrode and said emitter arrangement with respect to each other. During operation, said emitter arrangement generates and emits charged particles, such as electrons, which are formed into a charged particle beam by said electrode. A part of said charged particle beam or charged particles from said emitter arrangement may impinge onto said electrode, which leads to an increased temperature of said electrode. An increased temperature of said electrode may lead to deformation, in particular expansion of said electrode. Since said electrode is positioned between said supports, in the absence of said flexure connections, such deformation would lead to bending and/or warping of said electrode, therewith changing the orientation and/or position of said electrode with respect to said emitter arrangement. A changed orientation and/or position distorts an electrical field formed between said emitter arrangement and said electrode. Said flexure connections enable said electrode to deform substantially in a radial direction with respect to the longitudinal center axis of said charged particle source arrangement, while preventing warping and/or bending of said electrode in a direction parallel to the longitudinal direction of said charged particle source arrangement.

Moreover, in practice, electric wires used for connecting the charged particle source arrangement to an external power supply, extend in a direction transverse to the main plane of for example said electrode. If said electric wires expand due to a temperature increase, the expanding force(s) act(s) on the electrodes which can lead to disturbance of the alignment of the electrode with respect to said emitter arrangement. By connecting said electric wires to said flexure connection, the flexure connection can absorb the expanding forces and lead these forces into said supports.

It is noted that said charged particle source arrangement may be arranged for generating an electron beam, wherein said emitter arrangement is adapted for emitting electrons from which an electron beam is formed.

In an embodiment, said one or more electrical wire connections are located at a portion of said flexure connections where a position and/or orientation of said flexure connection with respect to said supports is substantially fixed. In a further embodiment said at least one of said one or more electrical wire connections is arranged on a distal end of said connecting lip, which is the free end of the connecting lip, of said at least one flexure connection. Arranging said electrical wire connections close to/at said supports contributes to maintaining the alignment of said electrode. Furthermore, by arranging said electrical wire connections at said distal end, the risk of any expanding force, which is caused by expansion of said electric wires, acting on said electrode is further reduced or in the ideal case prevented.

In an embodiment said electrode comprises a plate-shaped electrode body with a beam aperture, which beam aperture is centered with respect to said optical axis. In a further embodiment, said flexure connection comprises a connecting lip provided at the outer circumference of said plate-shaped electrode body, wherein said connecting lip defines a slit between said connecting lip and said plate-shaped electrode body. If said electrode is not provided with one or more flexure connections, due to charged particles impinging onto said electrode, a temperature increase of said electrode can lead to thermal expansion of said electrode radially outwards with respect to the longitudinal center axis of said charged particle source arrangement. Such thermal expansion of said electrode is enabled by said one or more flexure connections with said connecting lips and said slits defined by said connecting lips, while the supports remain in position and said electrode is prevented from warping and/or bending. Thereby the (intended) orientation and/or position of said electrode and the charged particle optical function thereof are maintained. The inner end of the slit may be provided with a circular inner shape or as a hole having circular shape, the radius of which being larger than the distance between the lip and the electrode formed by the slit. In some embodiments, the slit further comprises a bend. Also this bend may comprise a circular inner shape. The circular inner shapes may contribute to the thermal expansion taking place in radial direction.

In an embodiment a plurality of said electrodes is provided. By the flexure connection provided at each electrode the mutual orientation and/or position can be maintained. Thereby, the charged particle optical function, for example a lens function, is maintained.

In an embodiment said charged particle source arrangement comprises two or more electrodes for forming a charged particle beam from said charged particles emitted by said emitter arrangement, wherein at least one of said two or more electrodes is rigidly connected to said one or more supports, preferably a most downstream electrode of said two or more electrodes is rigidly connected to said one or more supports. During use of said charged particle source arrangement, said most downstream electrode is most likely arranged on a charged particle optical arrangement of an exposure system. Due to said arrangement, thermal energy absorbed by said most downstream electrode is conducted towards and into said charged particle optical arrangement, therewith minimizing or preventing any temperature increase of said most downstream electrode.

In an embodiment said emitter arrangement comprises a cathode for emitting said charged particles, wherein said cathode is received within a cathode carrying element which is connected to said one or more supports by means of a flexure connection. In a further embodiment said cathode carrying element comprises a plate-shaped carrying body with a cathode aperture for receiving at least a part of said cathode, preferably wherein said flexure connection comprises a connecting lip provided at the outer circumference of said plate-shaped carrying body, wherein said connecting lip defines a slit between said connecting lip and said plate-shaped carrying body. During operation of said charged particle source arrangement, the temperature of said charged particle source arrangement and/or said cathode carrying element may increase, which may lead to deformation, in particular expansion of said plate-shaped carrying element in a radial direction. Said flexure connections prevent said cathode carrying element from bending and/or warping in the longitudinal direction of said charged particle source arrangement as explained above in relation to said electrode.

In an embodiment said charged particle source arrangement comprises a frame including a first frame part, a second frame part, and one or more rigid support members which are arranged between said first frame part and said second frame part, and a power connecting assembly arranged at said first frame part, wherein said charged particle source arrangement is arranged at said second frame part and is electrically connected to said connecting assembly via electrical wiring. During connection of an external power supply to said power connecting assembly, a force is exerted onto said power connecting assembly. Due to the arrangement of said power connecting assembly on said first frame part, this force is lead into said first frame part. The force led into the first frame part can be transferred from said first frame part to said second frame part via the rigid support members, therewith preventing that said force acts on said charged particle source arrangement and providing a strain relieving arrangement.

According to a fifth aspect, the disclosed embodiments provide a charged particle source module according to the first or second aspect of the disclosed embodiments, wherein the charged particle source arrangement is a charged particle source arrangement according to the fourth aspect of the disclosed embodiments.

According to a sixth aspect, the disclosed embodiments provide a method of manufacturing a semiconductor device by means of a charged particle source module according to the first or second aspect of the disclosed embodiments, or by means of a charged particle source arrangement according to the fourth aspect of the disclosed embodiments, the method comprising the steps of:
  placing a wafer downstream of said charged particle source module or said charged particle source arrangement;
  processing said wafer including projecting an image or a pattern on said wafer by means of a charged particle beam generated and emitted by the charged particle source module or said charged particle source arrangement; and
  performing subsequent steps in order to generate a semiconductor device by means of said processed wafer The subsequent steps of manufacturing a semiconductor device from said processed wafer are known in the technical field of manufacturing semiconductor devices. A number of said subsequent steps are for example described in the United States patent application No. US 2014/0176920 A1 of the Applicant.

According to a seventh aspect, the disclosed embodiments provide a method for inspecting a target by means of a charged particle source module according to the first or second aspect of the disclosed embodiments, or by means of a charged particle source arrangement according to the fourth aspect of the disclosed embodiments, the method comprising the steps of:
  positioning said target downstream of said charged particle source module or said charged particle source arrangement;
  directing a charged particle beam generated and emitted by said charged particle source module or said charged particle source arrangement towards said target;
  detecting charged particles transmitted, emitted and/or reflected by said target in response to the charged particle beam directed towards said target; and
  performing subsequent steps in order to inspect said target by means of data from the step of detecting charged particles.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The disclosed embodiments will be elucidated on the basis of exemplary embodiments as shown in the attached drawings, in which.

DETAILED DESCRIPTION OF THE DRAWINGS

Figure 1:
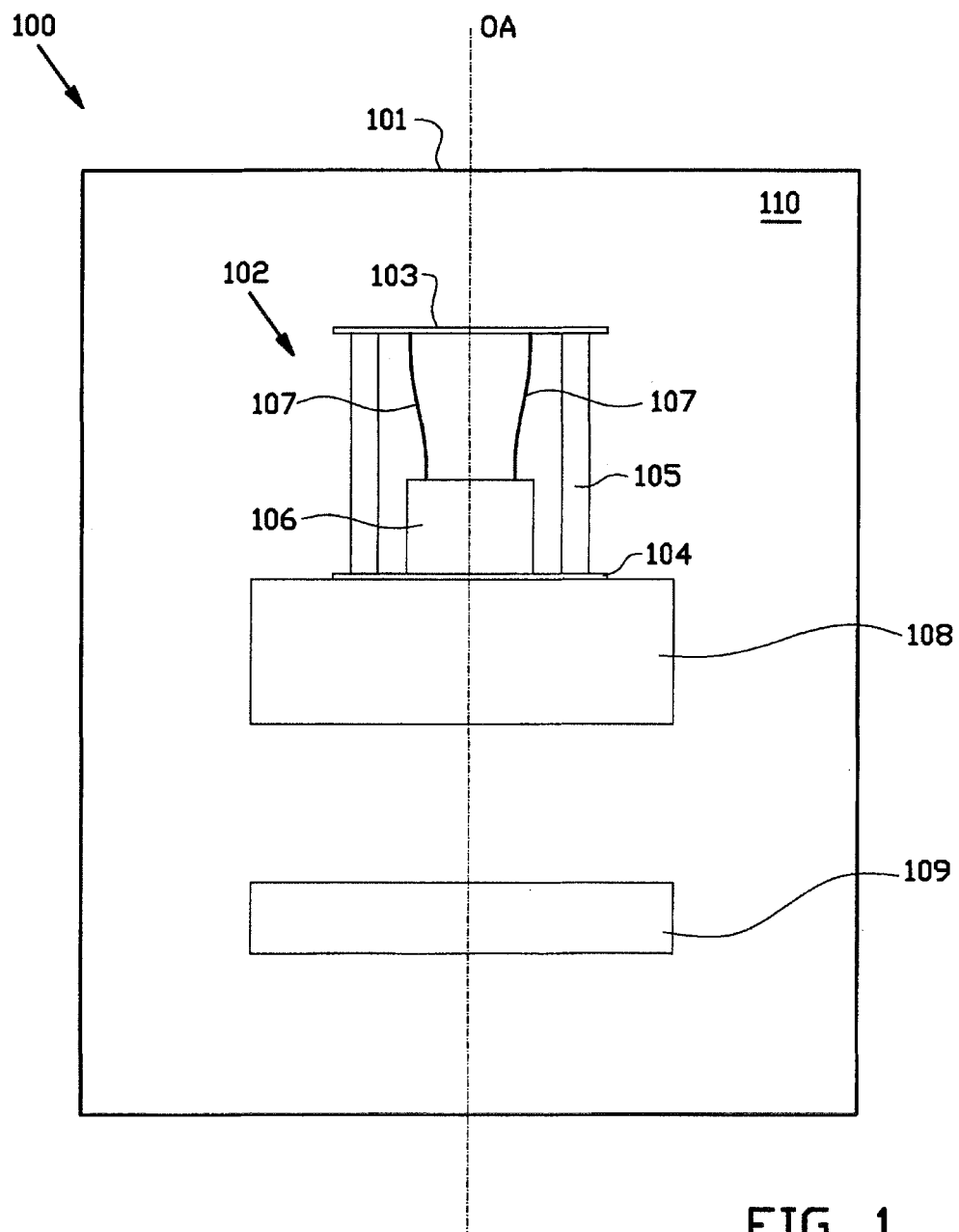
FIG. 1 schematically shows an example of an exposure apparatus with a charged particle source module.

FIG. 1 schematically shows an example of an exposure system 100 with a charged particle source module 102. The exposure apparatus 100 comprises a housing 101 in which a charged particle source module 102 is placed with a first rigid frame part 103, a second rigid frame part 104 and rigid bars 105 arranged between and rigidly connected to the first frame part 103 and the second frame part 104. The charged particle module 102 comprises a power connecting assembly on the first frame part 103, and a charged particle source arrangement 106 arranged at the second frame part 104 and electrically connected to the power connecting assembly via flexible electrical wires 107. The charged particle source arrangement module 102 is arranged at a charged particle optical arrangement 108, such as a magnetic or an electrostatic collimator. The charged particle optical arrangement 108 is adapted to direct a charged particle beam received from the charged particle source module towards a target 109 along an optical axis OA. The charged particle source module 102, the charged particle optical arrangement 108 and the target 109 are placed within a vacuum part 110 of the exposure system 100. The exposure system 100 can be one of a lithography system, an inspection system or a microscopy system. The exposure system 100 is schematically shown in FIG. 1 and the construction details of each of the known mentioned systems are known within the relevant technical field.

For example when said exposure system 100 is a lithography system, said lithography system may further comprise inter alia a collimator for collimating said charged particle beam from the charged particle source module 102, an aperture array for generating individual beamlets, and a deflector array (beam blanker array) with multiple deflectors each arranged for deflecting an individual beamlet. Further, said exposure system 100 may comprise a beam stop array with an array of apertures, one aperture for each individual beamlet and a lens array with an array of lenses for focusing the charged particle beamlets onto the target 109. The arrangement of the parts of said lithography system is known within the relevant technical field. An example of a lithography system is for example shown in international patent application WO 2009/127659 A2 of the Applicant.

For example when said exposure system 100 is an electron microscopy system, the microscopy system may further comprise an optical system arranged to direct a electron beam from said charged particle source module 102 towards several electron lenses which are arranged to focus the electron beam onto the surface of the target 109. Said exposure system 100 may be provided with one or more deflectors for scanning the electron beam over the surface of the target 109. Said exposure system 100 may be provided with sensors which can detect the scattered electrons, secondary electrons and/or generated light from said target 109.

Figure 2A:
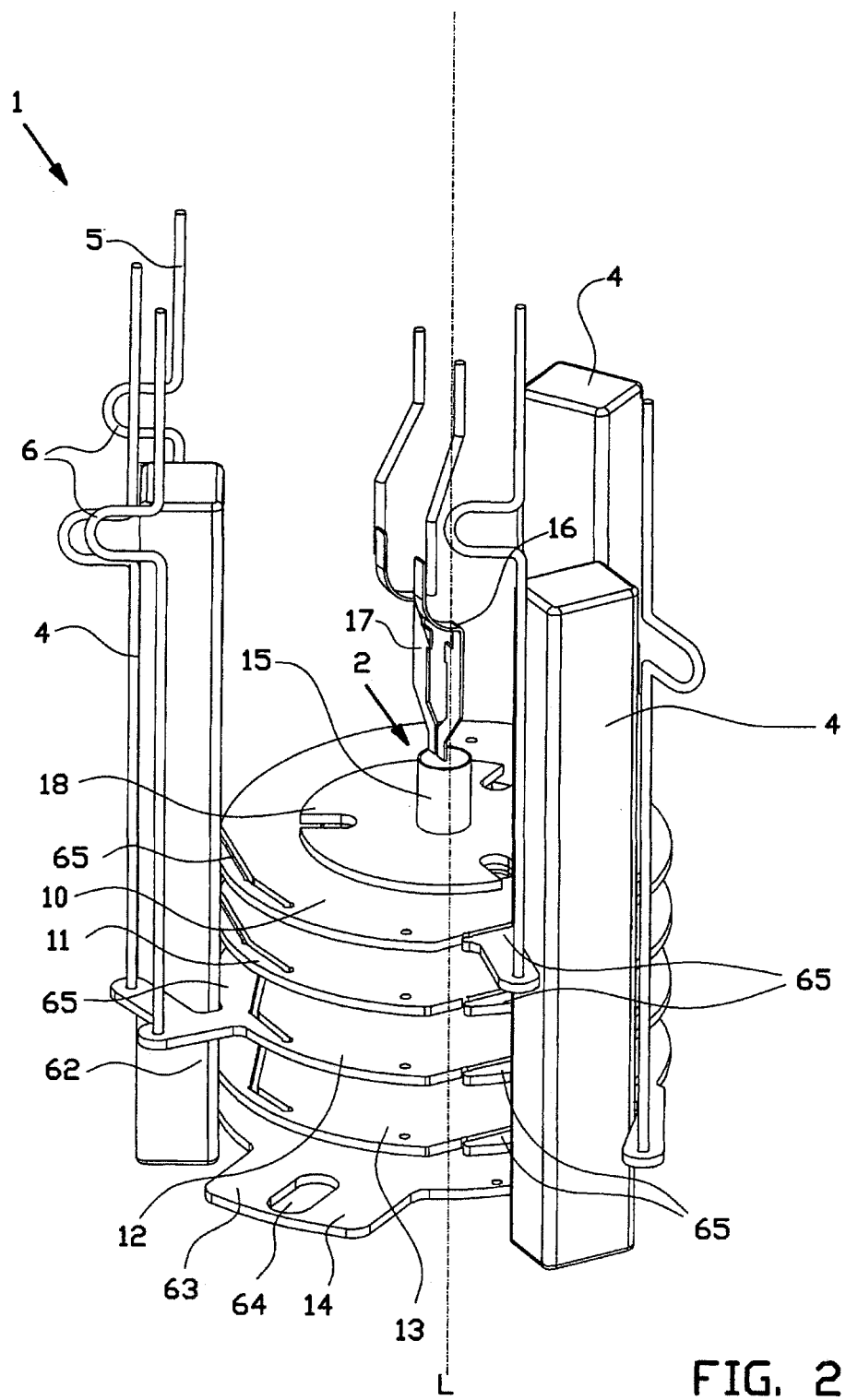
FIG. 2A shows an isometric view of a charged particle source arrangement having an emitter arrangement, and electrodes.

FIG. 2A shows an example of a charged particle source arrangement 1, which can correspond to the charged particle source arrangement 106 of FIG. 1. The charged particle source arrangement 1 comprises an emitter arrangement 2 which is provided for emitting charged particles in an emitting direction towards a surface or a target, such as a wafer. The charged particle source arrangement 1 comprises multiple electrodes 10-14 downstream of said emitter arrangement 2, also known as shaping electrodes, which electrodes 11-14 are configured for extracting said charged particles emitted by said emitter arrangement 2 and to form the charged particles into a beam of charged particles. The emitter arrangement 2 and the electrodes 11-14 are connected to and retained between supports, for example glass rods 4 which are configured for maintaining the emitter arrangement 2 and the electrodes 11-14 in a desired position and orientation with respect to each other. Each of the supports is connected to each of the emitter arrangement 2 and the electrodes 11-14. The emitter arrangement 2 and the electrodes 11-14 can be connected to a non-shown external power supply via electric wires 5 with service loops 6. These service loops can be provided as U-bends, extending substantially perpendicular to the extension of the electrical wire, as illustrated in FIG. 2A. In FIG. 2A, not all electrical wires are shown. It is however understood that to each electrode at least one electrical wire is connected.

Alternatively, the service loops can be provided as full loops, formed by the electrical wire making a full 360° turn. It is noted that the service loops shaped as U-bends require less energy to deform in comparison with service loops shaped as full loops.

As illustrated in FIG. 2A the emitter arrangement 2 comprises an emitter body 15. A first filament connection 16 and a second filament connection 17 are connected to the emitter body 15, wherein both of the first and second filament connections 16 and 17 are connected to electrical wires 5 in order to connect the emitter arrangement 2 to an external power supply. As illustrated in FIG. 2A the emitter arrangement 2 comprises a carrying element 18 attached to a plate-shaped carrying body 10 including an emitter aperture allowing passage to at least a charged particle beam, such as an electron beam, emitted from the emitter arrangement 2. The plate-shaped carrying body 10 is provided with an electrical wire 21 for connecting the plate-shaped carrying body 19 to a non-shown external power supply. Hence, the plate-shaped carrying body 10 may also be considered an electrode.

The emitter arrangement 2 may comprise a single cathode for emitting a charged particle beam, for example a thermionic cathode heated by a filament, or tandem arrangement of a thermionic cathode heated by another cathode. For a detailed description of the construction and working of the emitter arrangement 2 with a tandem arrangement, reference is made to the international patent application WO 2015/101538 A1 of the Applicant, which is fully incorporated herein by reference. It is noted that other kinds of emitter arrangements are possible.

Figure 2B:
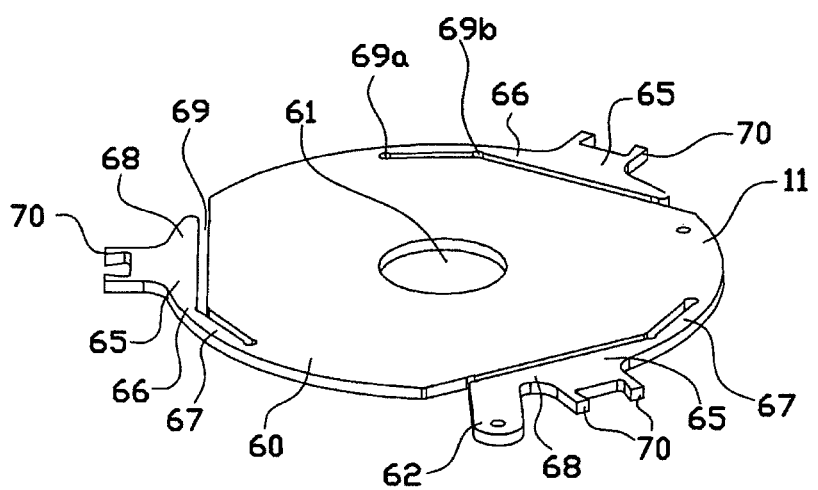
FIG. 2B shows an isometric view of an electrode.

As shown in FIGS. 2A and 2B, each of the electrodes 11-14 and the plate-shaped carrying body 10 comprises a plate-shaped electrode body 60, whereby each of the plate-shaped electrode body 60 comprises a beam aperture 61 which allows passage to a charged particle beam B. The diameter of each of the subsequent beam apertures 61 of each of the electrodes 11-14 increases with each subsequently beam aperture 61 in the downstream direction parallel to the longitudinal direction L, also referred to as optical axis, of the charged particle source arrangement 1. It is therefore possible to generate and emit a diverging charged particle beam by the charged particle source arrangement 1.

The electrodes 11-13 placed upstream of the most downstream electrode 14 and downstream of the emitter arrangement 2 comprises one or two electrical connecting elements 62 for electrically connecting each of the electrodes 11-13 to a non-shown external power supply. FIG. 2B only shows one electrode 11, and the remaining electrodes 12-13 differ from the shown electrode 10 in the location of the electrical connecting elements 62. The one or two connecting elements 62 of each electrode 11-13 are configured in such way that two electrical wires are connected to each of the electrodes 11-13.

As illustrated in FIG. 2B, flexure connections 65 are provided at the circumference of the electrode body 60, which flexure connections 65 are provided for connecting the electrodes 11-13 and the carrying body 10 to the glass rods 4. Each of the flexure connections 65 comprises a connecting lip 66 provided at the outer circumference of the electrode body 60, somewhat radially projecting thereof and extending in the circumferential direction thereof. The connecting lips 66 are equally distributed over the outer circumference of the electrode body 60. Each of the connecting lips 66 has a first lip part 67 and a second lip part 68, wherein the first lip part 67 is connected to the electrode body 60 at one end and to the second lip part 68 at the other end. Each of the connecting lips 66 defines a slit 69 between the connecting lip 66 and the outer circumference of the electrode body 60. As can be seen in FIG. 2B, the inner end 69a of the slit 69 has a circular inner shape. In case the slit 69 comprises a bend 69b, as in the illustrated embodiment, also this bend comprises a circular inner shape. The circular inner shapes may contribute to absorbing the thermal expansion taking place in radial direction. The second lip part 68 of each connecting lip 66 comprises connecting elements 70 which are taken up in one of the glass rods 4 to rigidly connect the flexure connections 65 to the glass rods 4, thereby enabling the electrodes 11-13 and the carrying body 10 to expand radially due to an increase of temperature while the thermal expansion is absorbed by the slits 69. In the shown embodiment, the most downstream electrode 14 is free of such flexure connections 65. As shown in FIG. 2A the electrical connecting elements 62 can be provided at one of the flexure connections 65 of one or more of the electrodes 11-13.

The most downstream electrode 14 further comprises non-shown connecting elements similar to the connecting elements 70 of the electrodes 11-13. The connecting elements extend radially outwards from the electrode body 60 of the most downstream electrode 14 for rigidly connecting the most downstream electrode 14 to the glass rods 4. As shown in FIG. 2A, the electrode body 60 of the most downstream electrode 14 comprises radially outwardly extending plate-shaped connecting projections 63 with an opening 64 provided therein. The plate-shaped connecting projections 63 may be used for connecting and/or aligning the charged particle source arrangement 1 to a non-shown exposure system or a charged particle optical arrangement thereof by means of a form closure.

As shown in FIG. 2A the glass rods 4 extend in a direction parallel to the longitudinal direction beyond the most downstream electrode 14, so that the lower ends of the glass rods 4 can contribute to aligning the charged particle source arrangement 1 with respect to an exposure system or a charged particle optical arrangement thereof on which the charged particle source arrangement 1 may be arranged.

Figure 3A:
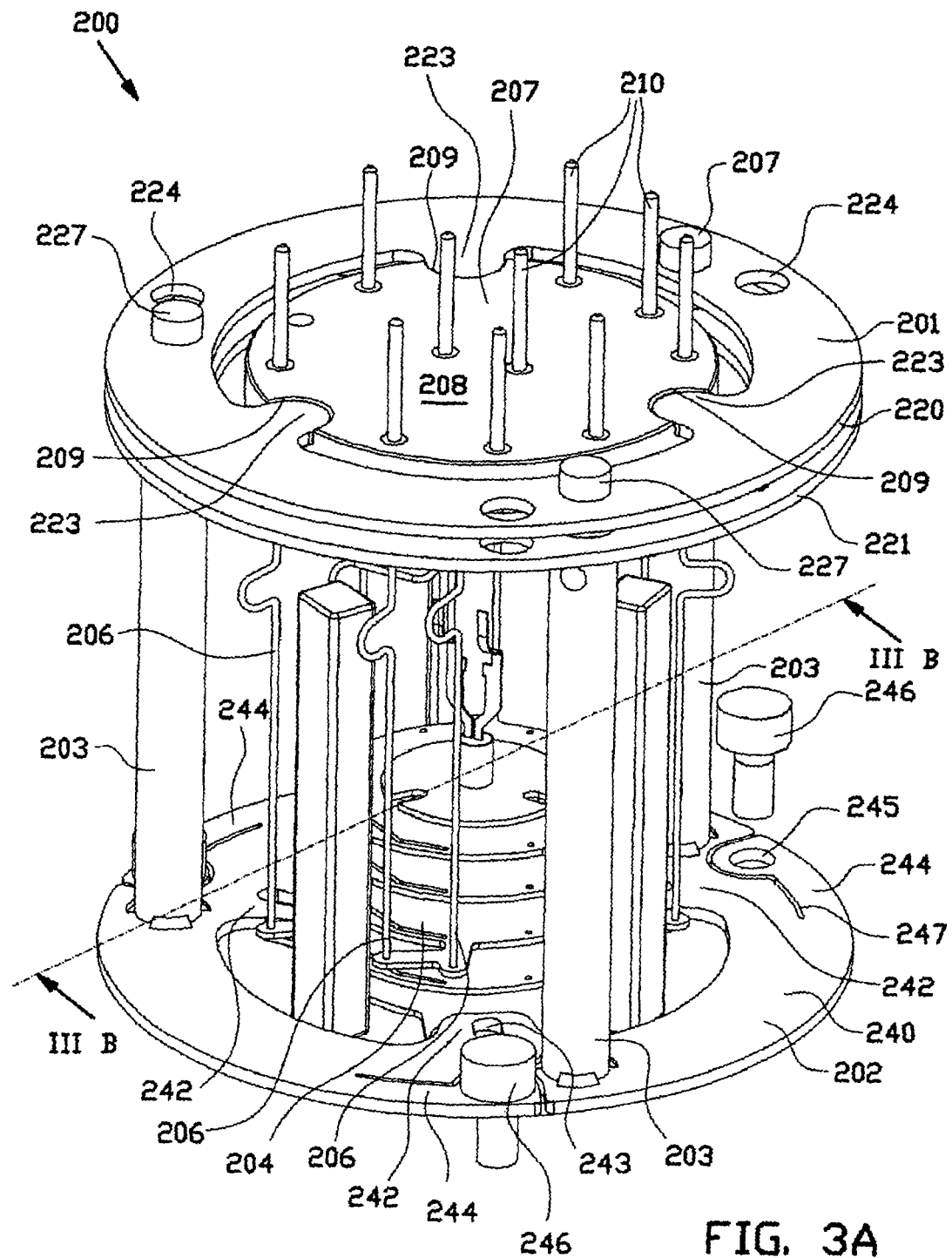
FIG. 3A shows an isometric view of an charged particle source module.

FIG. 3A shows an example of a charged particle source module 200, which can correspond to the charged particle source module 102 of FIG. 1. The charged particle source module 200 comprises a frame with a first frame part 201, a second frame part 202 and rigid support members in the form of rigid bars 203, which are arranged between the first frame part 201 and the second frame part 202. Different parts of said frame may be made of non-magnetic material or non-ferrous material, such as a material comprising titanium. The charged particle source module 200 further comprises a charged particle source arrangement 204 with electrical wires 206, which is arranged at the second frame part 202. For describing the charged particle source module 200, it is provided that the charged particle source arrangement 204 corresponds to the charged particle source arrangement 1 as described above. The charged particle source module 200 further comprises a power connecting assembly 207, wherein the charged particle source arrangement 204 is electrically connected to the power connecting assembly 207 via the electrical wires 206.

Figure 3B:
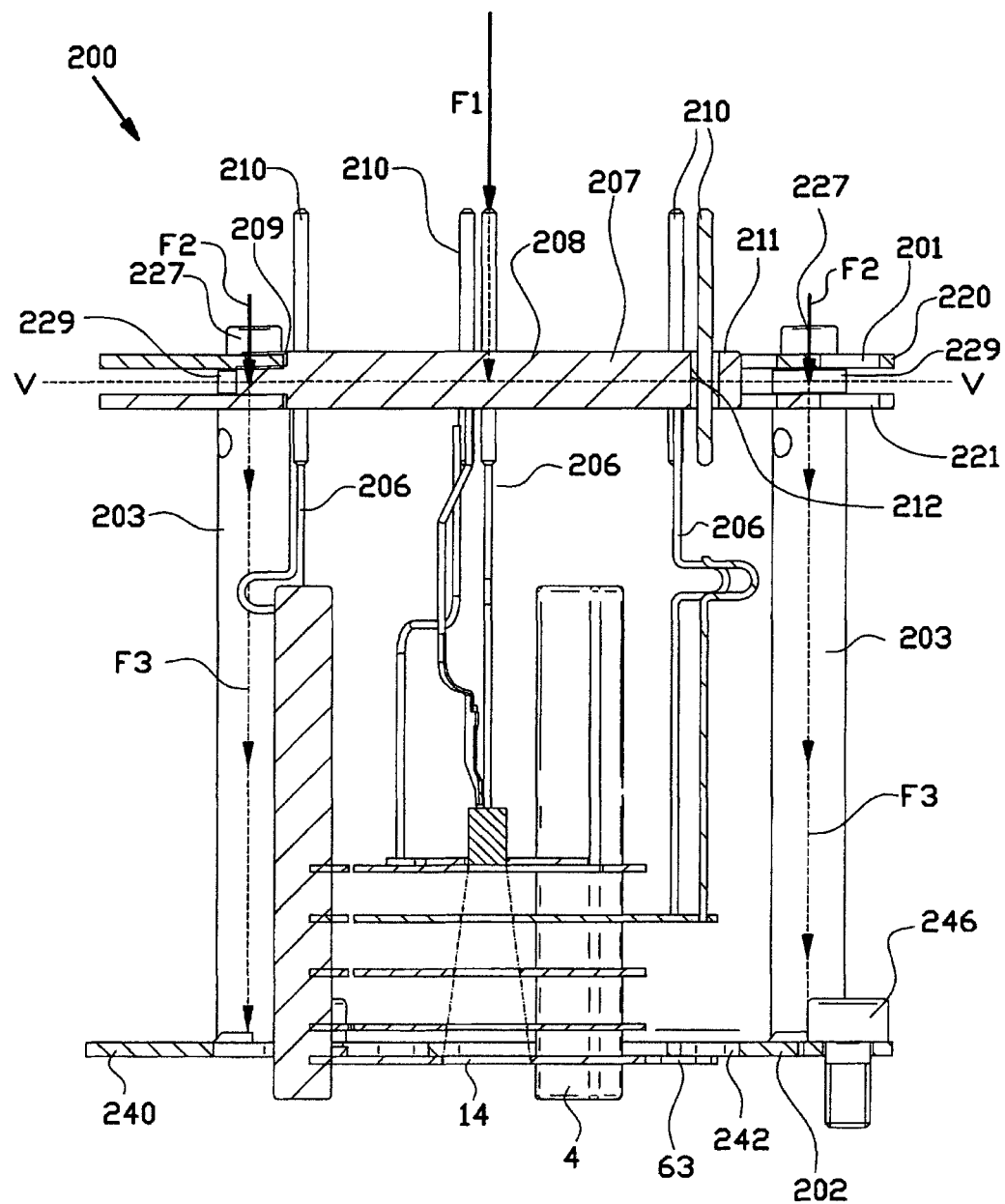
FIG. 3B shows a cross-section of said charged particle source module of FIG. 3A along line IIIB.

As illustrated in FIGS. 3A and 3B the power connecting assembly 207 comprises a non-conductive circular support plate 208 which is arranged at the first frame part 201. The support plate 208 may be manufactured from for example Macor®, a machinable glass-ceramic. The support plate 208 has securing recesses 209 which are provided in the upper and lower surface of the support plate 208 and are intended for arranging the support plate 208 on the first frame part 201. The securing recesses 209 are provided at the outer circumference of the support plate 208 and are uniformly distributed in the circumferential direction thereof. The power connecting assembly 207 further comprises electrical connectors 210 for electrically connecting the electrical wires 206 to a non-shown external power supply, which electrical connectors 210 extend through the support plate 208 in a direction substantially parallel to the rigid bars 203. As best shown in FIG. 3B the electrical connectors 210 are received within connector openings 211 of the support plate 208, whereby a seal, in particular a glass seal 212 is provided between the inner edge of each of the connectors openings 211 and the electrical connector 210 received within the respective connector opening 211.

As schematically shown in FIG. 3B when a force F1 is exerted onto one or more of the electrical connectors 210 of the power connecting assembly 207, thereby exerting a force onto plane V, a force F2 is applied through the first frame part 201 onto the rigid bars 203. Said force F1, F2 is led towards and into the rigid bars 203, as is indicated schematically by force path F3. Via the rigid bars 203, the force is led towards and into the second frame part 202 via which the force may be transferred to for example an exposure system or a charged particle optical arrangement thereof on which the charged particle source module 200 may be arranged. Thereby a strain relieving arrangement is achieved.

The first frame part 201 comprises two substantially parallel annular plates 220, 221, for example made of a non-ferrous material such as a material comprising titanium, as shown in FIGS. 3A and 3B. At the inner circumference, each of the annular plates 220, 221 has radially inwards extending securing projections 223 which are uniformly distributed over the inner circumference of the annular plates 220, 221. The securing projections 223 are provided for clamping the support plate 208 there between. In the clamped configuration, the securing projections 223 of the lower annular plate 220 are received within the securing recesses 209 at the lower surface of the support plate 208 and the securing projections 223 of the upper annular plate 220 are received within the securing recesses 209 at the upper surface of the support plate 208.

The annular plates 220, 221 comprises attachment apertures which are adapted for receiving attachment screws or bolts 227 and/or rejuvenations provided at the upper end of the rigid bars 203, such that the annular plates 220, 221 become connected to each other. As illustrated in FIG. 3B spacers 229 are provided between the upper and lower annular plates 220, 221, which spacers 229 are adapted for receiving the attachment screws or bolts 227 and/or rejuvenations provided at the upper end of the rigid bars 203. The thickness of the spacers 229 is slightly smaller than the thickness of the support plate 208.

As illustrated in FIG. 3A the second frame part 202 comprises an annular mounting plate 240, which is for example made of non-ferrous material such as a material comprising titanium. At the inner circumference, the annular mounting plate 240 comprises plate-shaped connecting projections 242 with are extending radially inwards. The plate-shaped connecting projections 242 are provided with apertures 243 which may be configured for receiving for example a pin or another securing means. As illustrated in FIG. 3E, the upper sides of the plate-shaped connecting projections 63 of the electrode 14 are connected to the lower sides of the plate-shaped connecting projections 242 of the second frame part 202, thereby arranging the electrode 14 between the second frame part 202 and an exposure tool or a charged particle optical arrangement thereof. The longitudinal axis of the charged particle source arrangement 204 preferably coincides with the longitudinal axis of the frame. Thereby, positioning of said charged particle source arrangement 204 in a plane substantially perpendicular to the longitudinal axis thereof is performed upon arranging the charged particle source module 200 to an exposure system or a charged particle optical arrangement thereof.

It is noted that in another embodiment, said most downstream electrode 14 and said annular mounting plate 240 may be formed as a single part.

The annular mounting plate 240 comprises mounting members including securing apertures 245 which are configured for receiving securing screws or bolts 246 for securing the charged particle source module 200 to an exposure system or a charged particle optical system thereof. Each of the securing apertures 245 is arranged within a connecting lip 244 of a flexure connection. Each of the connecting lips 244 is provided near the outer circumference of the annular mounting plate 240 and extends in the circumferential direction thereof. The connecting lips 244 are equally distributed over the outer circumference of the annular mounting plate 240. Each of the connecting lips 244 defines a slit 247 between the connecting lip 244 and the remaining of the annular mounting plate 240. Thereby, tilting of the charged particle source module 200 is prevented upon arranging the charged particle source module 200 to an exposure system or a charged particle optical arrangement thereof.

It is noted that the attachment apertures 224 in the first frame part 201 are provided in line with the securing apertures 245 and the securing bolts or screws 246 received therein, such that the securing bolts or screws 246 are accessibly by a tool via the attachment apertures 224.

It is noted that the rigid bars 203 are rigidly connected to the second frame part 202, in particular the annular mounting plate 240 thereof, for example by means of welding.

The embodiments may further be described using the following clauses:

1. Charged particle source module for generating and emitting a charged particle beam, comprising:
    a frame including a first rigid frame part, a second rigid frame part, and one or more rigid support members which are arranged between and rigidly connected to said first frame part and said second frame part;
    a charged particle source arrangement for generating a charged particle beam, wherein said charged particle source arrangement is arranged at said second frame part; and
    a power connecting assembly arranged at said first frame part,
   wherein said charged particle source arrangement is electrically connected to said power connecting assembly via electrical wiring.
2. Charged particle source module for generating and emitting a charged particle beam, comprising:
    a frame including a first frame part, a second frame part, and one or more rigid support members which are arranged between said first frame part and said second frame part;
    a charged particle source arrangement for generating a charged particle beam, wherein said charged particle source arrangement is arranged at said second frame part; and
    a power connecting assembly arranged at said first frame part,
   wherein said charged particle source arrangement is electrically connected to said power connecting assembly via electrical wiring,
   wherein said electrical wiring comprises one or more wires with a service loop.
3. Charged particle source module according to clause 1 or clause 2, wherein said frame comprises mounting members which are connected to said second frame part by flexure connections, preferably wherein said second frame part comprises a mounting plate and each of said flexure connections comprises a connecting lip provided at the outer circumference of said mounting plate, wherein each connecting lip defines a slit between said mounting plate and said connecting lip.
4. Charged particle source module according to any one of the preceding clauses, wherein said first frame part, said second frame part and/or said one or more rigid support members are made of a non-ferrous material.
5. Charged particle source module according to any one of the preceding clauses, wherein said power connecting assembly is rigidly connected to said first frame part, and said charged particle source arrangement is rigidly connected to said second frame part.
6. Charged particle source module according to any one of the preceding clauses, wherein said power connecting assembly comprises an electrically non-conductive connecting plate which is arranged at said first frame part of said frame, wherein said power connecting assembly comprises one or more connectors.
7. Charged particle source module according to clause 6, wherein said one or more connectors extend through said electrically non-conductive connecting plate in a direction substantially parallel to said support members of said frame.
8. Charged particle source module according to clause 6 or clause 7, wherein said first frame part comprises two substantially parallel plates, wherein the power connecting assembly is secured, preferably clamped between said two plates.

9. Charged particle source module according to any one of the preceding clauses, wherein said charged particle source arrangement comprises an emitter arrangement configured for emitting charged particles, and an electrode for forming a charged particle beam from said charged particles emitted by said emitter arrangement, preferably wherein said charged particle source arrangement comprises two or more electrodes for forming a charged particle beam from said charged particles emitted by said emitter arrangement, wherein a most downstream electrode of said two or more electrodes is preferably arranged at said second frame part of said frame, wherein said most downstream electrode and said second frame part are preferably formed as a single part.

10. Charged particle source module according to clause 9, wherein said emitter arrangement and said electrode are connected to one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other, preferably wherein at least one of said emitter arrangement and said electrode is connected with said one or more supports by means of a flexure connection.

11. Charged particle source module according to clause 10, wherein at least one of said emitter arrangement and said electrode is rigidly connected to said one or more supports, preferably wherein said most downstream electrode is rigidly connected to said one or more supports.

12. Charged particle source module according to clause 10 or clause 11, wherein said emitter arrangement and said electrode comprise a plate-shaped electrode body, wherein said flexure connection comprises a connecting lip provided at the outer circumference of said plate-shaped electrode body, wherein said connecting lip defines a slit between said connecting lip and said plate-shaped electrode body.

13. Charged particle source module according to any one of the clauses 9-13, when dependent on clause 6, wherein said electrical wiring is peripherally connected to said electrode and is connected to said one or more connectors, and wherein the electrical wiring extends in a direction substantially parallel to said support members of said frame.

14. Charged particle source module according to any one of the preceding clauses, wherein the electrical wiring is flexible electrical wiring.

15. Charged particle source module according to any one of the preceding clauses, when dependent on clause 1, wherein said electrical wiring comprises one or more wires with a service loop.

16. Exposure system for emitting a charged particle beam towards a surface or a target, comprising:
    a charged particle source module for generating and emitting a charged particle beam according to any one of the preceding clauses; and
    a charged particle optical arrangement configured to receive the charged particle beam generated and emitted by the charged particle source module, and to direct said charged particle beam towards said surface or said target,
    wherein said second frame part of said frame is arranged at said charged particle optical arrangement.

17. Exposure system according to clause 16, wherein said charged particle optical arrangement comprises a collimator, wherein said charged particle source module is arranged at said collimator.

18. Exposure system according to clause 16 or clause 17, wherein the exposure system is selected from a group comprising a lithography system, an inspection system or a microscopy system.

19. Charged particle source arrangement for generating a charged particle beam, comprising:
    an emitter arrangement configured for emitting charged particles;
    an electrode for forming a charged particle beam from said charged particles emitted by said emitter arrangement; and
    one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other,
    wherein said electrode is connected with said one or more supports by means of a flexure connection,
    wherein said electrode and/or said emitter arrangement comprises one or more electrical wire connections for connection of electrical wiring, wherein at least one of said one or more electrical wire connections is arranged on said flexure connection.

20. Charged particle source arrangement according to 19, wherein said one or more electrical wire connections are located at a portion of said flexure connections where a position and/or orientation of said flexure connection with respect to said supports is substantially fixed.

21. Charged particle source arrangement according to clause 19 or clause 20, wherein said at least one of said one or more electrical wire connections is arranged on a distal end of said connecting lip of said flexure connection.

22. Charged particle source arrangement according to any one of the clauses 19-21, wherein said electrode comprises a plate-shaped electrode body with a beam aperture, which beam aperture is centered with respect to said optical axis.

23. Charged particle source arrangement according to clause 22, wherein said flexure connection comprises a connecting lip provided at the outer circumference of said plate-shaped electrode body, wherein said connecting lip defines a slit between said connecting lip and said plate-shaped electrode body.

24. Charged particle source arrangement according to any one of the preceding clauses 19-23, wherein said charged particle source arrangement comprises two or more electrodes for forming a charged particle beam from said charged particles emitted by said emitter arrangement, wherein at least one of said two or more electrodes is rigidly connected to said one or more supports, preferably wherein a most downstream electrode of said two or more electrodes is rigidly connected to said one or more supports.

25. Charged particle source arrangement according to any one of clauses 19-24, wherein said emitter arrangement comprises a cathode for emitting said charged particles, wherein said cathode is received within a cathode carrying element which is connected to said one or more supports by means of a flexure connection.

26. Charged particle source arrangement according to clause 25, wherein said cathode carrying element comprises a plate-shaped carrying body with a cathode aperture for receiving at least a part of said cathode, preferably wherein said flexure connection comprises a connecting lip provided at the outer circumference of said plate-shaped carrying body, wherein said connecting lip defines a slit between said connecting lip and said plate-shaped carrying body.

27. Charged particle source arrangement according to any one of the preceding clauses 19-26, further comprising a frame including a first frame part, a second frame part, and one or more rigid support members which are arranged between said first frame part and said second frame part, and a power connecting assembly arranged on said first frame part, wherein said charged particle source arrangement is arranged on said second frame part and is electrically connected to said power connecting assembly via electrical wiring.

28. Charged particle source module according to any one of the clauses 1-15, wherein the charged particle source arrangement is a charged particle source arrangement according to any one of the clauses 19-27.

29. Method of manufacturing a semiconductor device by means of a charged particle source module according to any one of the clauses 1-15, or a charged particle source arrangement according to any one of the clauses 19-27, the method comprising the steps of:
    placing a wafer downstream of said charged particle source module or said charged particle source arrangement;
    processing said wafer including projecting an image or a pattern on said wafer by means of a charged particle beam generated and emitted by said charged particle source module or said charged particle source arrangement; and
    performing subsequent steps in order to generate a semiconductor device by means of said processed wafer.

30. Method for inspecting a target by means of a charged particle source module according to any one of the clauses 1-15, or a charged particle source arrangement according to any one of the clauses 19-27, the method comprising the steps of:
    positioning said target downstream of said charged particle source module or said charged particle source arrangement;
    directing a charged particle beam generated and emitted by said charged particle source module or said charged particle source arrangement towards said target;
    detecting charged particles transmitted, emitted and/or reflected by said target in response to the charged particle beam directed towards said target; and
    performing subsequent steps in order to inspect said target by means of data from the step of detecting charged particles.

It is to be understood that the above description is included to illustrate the operation of the preferred embodiments and is not meant to limit the scope of the disclosed embodiments of the invention. From the above discussion, many variations will be apparent to one skilled in the art that would yet be encompassed by the scope of the present invention.

The invention claimed is:

1. A charged particle source module for generating and emitting a charged particle beam, comprising:
    a frame including a first rigid frame part, a second rigid frame part, and one or more rigid support members which are arranged between and rigidly connected to said first frame part and said second frame part;
    a charged particle source arrangement for generating a charged particle beam, wherein said charged particle source arrangement is arranged at said second frame part, and said charged particle source arrangement is secured to said frame at only said second frame part among said first frame part and said second frame part; and
    a power connecting assembly connected to said first frame part,
    wherein said charged particle source arrangement is electrically connected to said power connecting assembly via electrical wiring.

2. The charged particle source module of claim 1, wherein said frame comprises mounting members which are connected to said second frame part by flexure connections, preferably wherein said second frame part comprises a mounting plate and each of said flexure connections comprises a connecting lip provided at the outer circumference of said mounting plate, wherein each connecting lip defines a slit between said mounting plate and said connecting lip.

3. The charged particle source module of claim 1, wherein said first frame part, said second frame part and/or said one or more rigid support members are made of a non-ferrous material.

4. The charged particle source module of claim 1, wherein said power connecting assembly is rigidly connected to said first frame part, and said charged particle source arrangement is rigidly connected to said second frame part.

5. The charged particle source module of claim 1, wherein said power connecting assembly comprises an electrically non-conductive connecting plate which is arranged at said first frame part of said frame, wherein said power connecting assembly comprises one or more connectors.

6. The charged particle source module according to claim 5, wherein said one or more connectors extend through said electrically non-conductive connecting plate in a direction substantially parallel to said one or more rigid support members of said frame.

7. The charged particle source module according to claim 5, wherein said first frame part comprises two substantially parallel plates, wherein the power connecting assembly is secured, preferably clamped between said two plates.

8. The charged particle source module of claim 1, wherein said charged particle source arrangement comprises an emitter arrangement configured for emitting charged particles, and an electrode for forming a charged particle beam from said charged particles emitted by said emitter arrangement, preferably wherein said charged particle source arrangement comprises two or more electrodes for forming a charged particle beam from said charged particles emitted by said emitter arrangement, wherein a most downstream electrode of said two or more electrodes is preferably arranged at said second frame part of said frame, wherein said most downstream electrode and said second frame part are preferably formed as a single part.

9. The charged particle source module-of claim 8, wherein said emitter arrangement and said electrode are connected to one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other, preferably wherein at least one of said emitter arrangement and said electrode is connected with said one or more supports by means of a flexure connection.

10. The charged particle source module-of claim 9, wherein at least one of said emitter arrangement and said electrode is rigidly connected to said one or more supports, preferably wherein said most downstream electrode is rigidly connected to said one or more supports.

11. The charged particle source module of claim 9, wherein said emitter arrangement and said electrode comprise a plate-shaped electrode body, wherein said flexure connection comprises a connecting lip provided at the outer circumference of said plate-shaped electrode body, wherein said connecting lip defines a slit between said connecting lip and said plate-shaped electrode body.

12. The charged particle source module of claim 8, said power connecting assembly comprising an electrically non-conductive connecting plate which is arranged at said first frame part of said frame, wherein said power connecting assembly comprises one or more connectors, wherein said electrical wiring is peripherally connected to said electrode and is connected to said one or more connectors, and wherein the electrical wiring extends in a direction substantially parallel to said support members of said frame.

13. The charged particle source module of claim 1, wherein the electrical wiring is flexible electrical wiring.

14. The charged particle source module of claim 1, wherein said electrical wiring comprises one or more wires with a service loop.

15. An exposure system for emitting a charged particle beam towards a surface or a target, comprising:
   a charged particle source module for generating and emitting a charged particle beam of claim 1; and
   a charged particle optical arrangement configured to receive the charged particle beam generated and emitted by the charged particle source module, and to direct said charged particle beam towards said surface or said target,
   wherein said second frame part of said frame is arranged at said charged particle optical arrangement.

16. The charged particle source module of claim 1, wherein the charged particle source arrangement is a charged particle source arrangement comprising:
   an emitter arrangement configured for emitting charged particles;
   an electrode for forming a charged particle beam from said charged particles emitted by said emitter arrangement; and
   one or more electrically non-conductive supports oriented substantially parallel to an optical axis defined by said emitter arrangement and said electrode, wherein each of said one or more supports is connected with an outer circumference of said emitter arrangement and with an outer circumference of said electrode, and wherein said one or more supports maintain the orientation and/or the position of said emitter arrangement and said electrode with respect to each other,
   wherein said electrode is connected with said one or more supports by means of a flexure connection,
   wherein said electrode and/or said emitter arrangement comprises one or more electrical wire connections for connection of electrical wiring, wherein at least one of said one or more electrical wire connections is arranged on said flexure connection.

17. The charged particle source module of claim 1, wherein said second frame part is downstream from said first frame part.

18. The charged particle source module of claim 1, wherein said electrical wiring interconnects said charged particle source arrangement with said power connecting assembly along an optical axis defined by said charged particle source arrangement, said electrical wiring optionally comprising one or more wires with a service loop.

19. The charged particle source module of claim 1, wherein said charged particle source arrangement is rigidly connected to said second frame part, and said charged particle source arrangement is flexibly connected to said first frame part via electrical wiring.

20. A charged particle source module for generating and emitting a charged particle beam, comprising:
   a frame including a first rigid frame part, a second rigid frame part, and one or more rigid support members which are arranged between and rigidly connected to said first frame part and said second frame part;
   a charged particle source arrangement for generating a charged particle beam, wherein said charged particle source arrangement is arranged at said second frame part; and
   a power connecting assembly connected to said first frame part,
   wherein said charged particle source arrangement is electrically connected to said power connecting assembly via electrical wiring, and
   wherein said electrical wiring interconnects said charged particle source arrangement with said power connecting assembly along an optical axis defined by said charged particle source arrangement, said electrical wiring optionally comprising one or more wires with a service loop.

* * * * *